United States Patent
Mori et al.

(10) Patent No.: US 7,724,941 B2
(45) Date of Patent: May 25, 2010

(54) DEFECT ANALYSIS PLACE SPECIFYING DEVICE AND DEFECT ANALYSIS PLACE SPECIFYING METHOD

(75) Inventors: Hiroyuki Mori, Kyoto (JP); Hisashi Sugihara, Kyoto (JP)

(73) Assignee: Omron Corporation, Kyoto-shi (JP)

( * ) Notice: Subject to any disclaimer, the term of this patent is extended or adjusted under 35 U.S.C. 154(b) by 887 days.

(21) Appl. No.: 11/580,227

(22) Filed: Oct. 13, 2006

(65) Prior Publication Data
US 2007/0109885 A1    May 17, 2007

(30) Foreign Application Priority Data
Nov. 15, 2005   (JP) ............................. 2005-330543

(51) Int. Cl.
G06K 9/00 (2006.01)
G01R 31/00 (2006.01)
(52) U.S. Cl. ................. 382/147; 382/149; 324/512; 702/35
(58) Field of Classification Search ......... 382/145–150; 324/500, 537, 512; 702/35; 348/87, 126
See application file for complete search history.

(56) References Cited

U.S. PATENT DOCUMENTS 6,952,653 B2 * 10/2005 Toth et al. ..................... 702/35

2005/0001646 A1 * 1/2005 Chung ......................... 324/764
2006/0238753 A1 * 10/2006 Tsuji et al. ............... 356/237.2

FOREIGN PATENT DOCUMENTS

| JP | 06-196900 | 7/1994 |
| JP | 11-298200 | 10/1999 |
| JP | 3511632 B | 1/2004 |
| JP | 3514486 B | 1/2004 |

OTHER PUBLICATIONS

Japanese Examination Report issued Sep. 29, 2009 and the English Translation of the Examination Report; 4 pgs.

* cited by examiner

*Primary Examiner*—Jon Chang
(74) *Attorney, Agent, or Firm*—Foley & Lardner LLP

(57) ABSTRACT

A defect analysis place specifying device for specifying defect analysis places from an inspection result of produced printed wiring boards in an electronic part mounting device for mounting parts on the printed wiring boards through plural steps, including an accepting unit for accepting plural printed wiring boards as inspection targets every predetermined unit, a defect mode specifying unit for specifying a defect mode having a predetermined frequency or more on the basis of the defect modes of the printed wiring boards and the occurrence frequencies thereof in the last step of the plural steps every unit accepted by the accepting unit, an extracting unit for extracting a combination having the same abnormal phenomenon causing the defect mode specified by the defect mode specifying unit in the other steps than the last step in the plural steps, and an output unit for outputting the combination extracted by the extracting unit.

10 Claims, 10 Drawing Sheets

FIG. 1

PRINT STEP MOUNT STEP REFLOW STEP

| DEFECT MODE | DEFECTIVE OCCURRENCE PLACE | | ABNORMAL PHENOMENON | | | | | | | | | |
|---|---|---|---|---|---|---|---|---|---|---|---|---|
| | | | SOLDER PRINT STEP | | | | PART MOUNT STEP | | | REFLOW STEP | | |
| | PART NUMBER | PRINTED WIRING BOARD SERIAL NUMBER | NO SOLDER | SOLDER IS DISPLACED | OVER-SOLDERING | ... | OMISSION | PART IS DISPLACED | PART TURNS DOWN | WETTABILITY ERROR | PART IS DISPLACED | FILLET IS EXCESSIVE | ... |
| PART DISPLACEMENT | 224 | 16 | | | | | | ◎ | | | ◎ | | |
| PART DISPLACEMENT | 224 | 33 | | | ○ | | | | | | ○ | | |
| PART DISPLACEMENT | 224 | ... | | ○ | | | | ○ | | | ○ | | |
| PART DISPLACEMENT | 271 | 8 | | | | | | ◎ | | | ◎ | | |
| PART DISPLACEMENT | 271 | 41 | | ○ | | | | | | | ○ | | |
| PART DISPLACEMENT | 308 | 38 | | | | | | ◎ | | | ◎ | | |
| PART DISPLACEMENT | ... | ... | | | | | | | | | ○ | | |
| WETTABILITY ERROR | 173 | 16 | ○ | | | | | | | ○ | | | |
| WETTABILITY ERROR | 298 | 44 | | | | | | ○ | | ○ | ○ | | |
| WETTABILITY ERROR | ... | ... | | | | | | | | ○ | | | |
| EXCESSIVE FILLET | 39 | 3 | | | ○ | | | | | | | ○ | |
| ... | ... | ... | | | | | | | | | | | |

DEFECT ANALYSIS PLACE SPECIFYING DEVICE AND DEFECT ANALYSIS PLACE SPECIFYING METHOD

This application claims priority from Japanese patent application 2005-330543, filed Nov. 15, 2005. The entire content of the aforementioned application is incorporated herein by reference.

BACKGROUND OF THE INVENTION

1. Field of the Invention

The present invention relates to a defect analysis place specifying device, a defect analysis place specifying method, a program for specifying a detect analysis place and a recording medium recorded with a program for specifying a defect analysis place, and particularly to a defect analysis place specifying device, a defect analysis place specifying method, a program for specifying a detect analysis place and a recording medium recorded with a program for specifying a defect analysis place that can specify a high-priority defect analysis place to efficiently improve the quality of products.

2. Description of the Related Art

A defective place specifying method in a surface mounting device has been disclosed in Japanese Patent No. 3,511,632 (paragraph no. 0009, etc. ), Japanese Patent No. 3,514,486 (paragraph no. 0009, etc.), etc. According to the method disclosed in the former Japanese Patent, defective places of printed wiring boards are individually analyzed every defective place and every printed wiring board to calculate the degree of incidence of the final defect by each step, and a cause for the defect is automatically predicted. According to the method disclosed in the latter Japanese Patent, when defective places are analyzed, the efficiency is enhanced by actively utilizing a condition reflecting a previous analysis result, thereby shortening the defect factor specifying time and enhancing the working efficiency.

The defective place specifying method of an electronic part mounting device has been hither carried out as described above. In order to reduce the defective fraction in the electronic part mounting device with the minimum time and effort, it is required to specify a defective place having a high defective fraction at an early stage and take a countermeasure to the defective place concerned.

However, in the former Japanese Patent, the defective places of each printed wiring board are individually analyzed one by one to estimate the causes of the defects (hereinafter referred to as "defect factor"), and thus it takes much time to perform the estimation of the defect factors, and also when countermeasures to the defect factors thus estimated are successively taken in turn, it takes more time to cover a desired defective fraction. Furthermore, in the latter Japanese Patent, the processing is efficiently executed, however, this method pays no attention to efficient enhancement of the quality of products with respect to the electronic part mounting device.

Furthermore, in order to efficiently enhance the quality of products, it is required to specify a set of defective places which can be estimated to be caused by a common defect factor and determine an analysis target from the defective places thus estimated. However, this method is very difficult for persons other than skilled persons.

SUMMARY OF THE INVENTION

The present invention has been implemented in view of the foregoing problem, and has an object to provide a defect analysis place specifying device, a defect analysis place specifying method, a program for specifying a detect analysis place and a recording medium recorded with a program for specifying a defect analysis place that can specify a high-priority defect analysis place to efficiently improve the quality of products without any skilled persons.

In order to attain the above object, according to the present invention, according to a first aspect of the present invention, a defect analysis place specifying device for specifying defect analysis places from an inspection result of produced printed wiring boards in an electronic part mounting device for mounting parts on the printed wiring boards through plural steps, comprises: an accepting unit for accepting plural printed wiring boards as inspection targets every predetermined unit; a defect mode specifying unit for specifying a defect mode having a predetermined frequency or more on the basis of the defect modes of the printed wiring boards and the occurrence frequencies thereof in the last step of the plural steps every unit accepted by the accepting unit; an extracting unit for extracting a combination having the same abnormal phenomenon causing the defect mode specified by the defect mode specifying unit in the other steps than the last step in the plural steps; and an output unit for outputting the combination extracted by the extracting unit.

The defect mode having the predetermined frequency or more is specified on the basis of the defect modes of the printed wiring boards and the occurrence frequencies thereof in the last step every input unit, and in the specified defect mode, the combination having the same abnormal phenomenon causing the defect mode in the steps other than the last step of the plural steps is extracted and output. Therefore, in the last step, the common factor causing the defect mode having a high occurrence frequency can be output.

As a result, with respect to plural printed wiring boards contained in a predetermined unit, defective analysis places having high priorities can be specified so that the quality can be efficiently improved by persons who are not skilled in the art.

Preferably, the defect mode specifying unit comprises a Pareto diagram creating unit for creating a Pareto diagram representing the defect modes of the printed wiring boards in the last step of the plural steps and the occurrence frequencies of the defect modes concerned, a defect mode having a predetermined frequency or more being specified from the Pareto diagram created by the Pareto diagram creating unit.

Still preferably, the defect mode having the predetermined frequency or more that is specified by the defect mode specifying unit is a defect mode having the highest frequency.

Still preferably, the defect mode having the predetermined frequency or more that is specified by the defect mode specifying unit is a defect mode contained in defect modes that have high occurrence frequencies and occupy a predetermined rate or more in the Pareto diagram.

Still preferably, the extracting unit extracts a combination having the same abnormal phenomenon in consideration of the position on the printed wiring board.

In the embodiment of the present invention, the extracting unit contains a data list creating unit for creating a data list for specifying abnormal phenomena and the occurrence positions thereof every defect mode, the combination being extracted on the basis of the data list created by the data list creating unit.

Furthermore, the defect analysis place specifying device may further comprise a storage unit for storing images of each of the printed wiring boards in the plural steps, wherein the extracting unit comprises a display unit for displaying the images stored in the storage unit, and a defect information accepting unit for accepting an input of defect information associated with the images displayed on the display unit, and the data list creating unit creates a data list on the basis of the defect information accepted by the defect information accepting unit.

According to a second aspect of the present invention, a defect analysis place specifying method for specifying defect analysis places from an inspection result of produced printed wiring boards in an electronic part mounting device for mounting parts on the printed wiring boards through plural steps, comprises: an accepting step for accepting plural printed wiring boards as inspection targets every predetermined unit; a defect mode specifying step for specifying a defect mode having a predetermined frequency or more on the basis of the defect modes of the printed wiring boards and the occurrence frequencies thereof in the last step of the plural steps every accepted unit; an extracting step for extracting a combination having the same abnormal phenomenon causing the defect mode specified in the defect mode specifying step in the other step than the last step in the plural steps; and an output step for outputting the extracted combination.

Preferably, the step for specifying the defect mode having the predetermined frequency or more comprises a step of creating a Pareto diagram representing the defect modes of the printed wiring boards in the last step of the plural steps and the occurrence frequencies of the defect modes concerned every accepted unit, and a step for specifying a defect mode having a predetermined frequency or more from the created Pareto diagram.

According to a third aspect of the present invention, a program for making a computer operate as a defect analysis place specifying device for specifying defect analysis places from an inspection result of produced printed wiring boards in an electronic part mounting device for mounting parts on the printed wiring boards through plural steps, the program making the computer execute: an accepting step for accepting plural printed wiring boards as inspection targets every predetermined unit; a defect mode specifying step for specifying a defect mode having a predetermined frequency or more on the basis of the defect modes of the printed wiring boards and the occurrence frequencies thereof in the last step of the plural steps every accepted unit; an extracting step for extracting a combination having the same abnormal phenomenon causing the defect mode in the other step than the last step in the plural steps; and an output step for outputting the extracted combination.

Preferably, the step for specifying the defect mode having the predetermined frequency or more contains a step of creating a Pareto diagram representing the defect modes of the printed wiring boards in the last step of the plural steps and the occurrence frequencies of the defect modes concerned every accepted unit, and a step for specifying a defect mode having a predetermined frequency or more from the created Pareto diagram.

Still preferably, the program may be stored in a computer-readable recording medium.

DETAILED DESCRIPTION OF THE PREFERRED EMBODIMENTS

Preferred embodiments of the present invention will be described hereunder with reference to the accompanying drawings.

Figure 1:
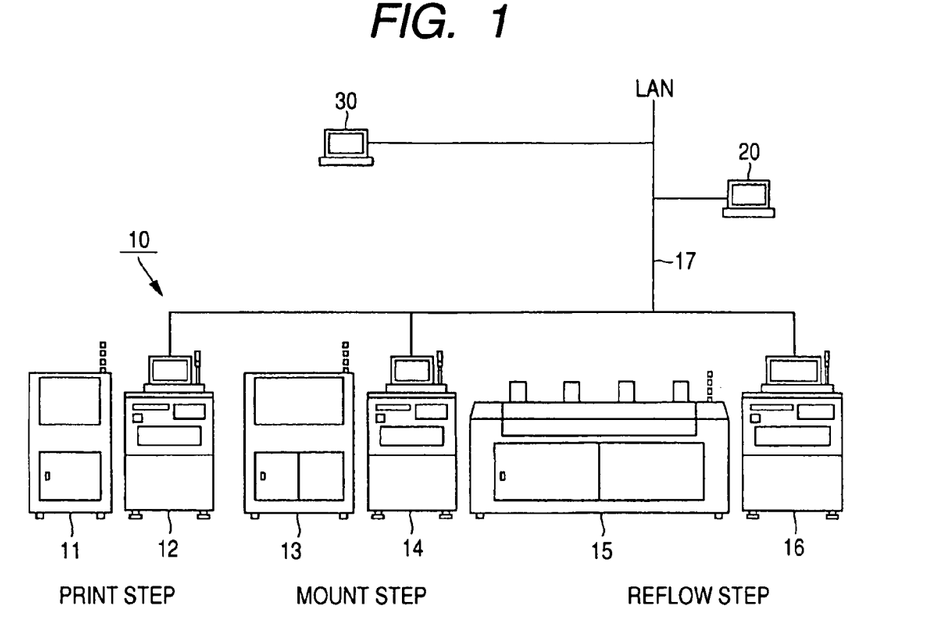
FIG. 1 is a overall diagram showing the periphery of a defect analysis place specifying device.

FIG. 1 is a block diagram showing the peripheral construction of an electrical part mounting device to which a defect analysis place specifying device of the present invention is applied. Referring to FIG. 1, a defect analysis place specifying device 20 is connected to an electronic part mounting device 10 and an inspection information accumulating device 30 for accumulating inspection information in the electronic part mounting device 10 so that data communication can be mutually communicated therebetween through LAN 17. Referring to FIG. 1, the electronic part mounting device 10 contains a print step, a mount step and a reflow step which are arranged from the upstream side to the downstream side with respect to the feeding direction of a printed wiring board on which parts are mounted. The respective steps are connected to each other through a conveyor, a robot and other feeding devices. Each step is provided with a device for executing the processing of the step.

The print step is provided with a printing machine 11 for printing a land on a printed wiring board, and a post-print inspection machine 12 for making an inspection after the print. The mount step is provided with a mounter 13 for mounting parts on the printed wiring board, and a post-mount inspection machine 14 for making an inspection after the mount. The reflow step is provided with a reflow furnace 15 for soldering terminals of parts to the land and a post-reflow inspection machine 16 for making an inspection after the solder.

The printing machine 11, the post-print inspection machine 12, the mounter 13, the post-mount inspection machine 14, the reflow furnace 15 and the post-reflow inspection machine 16 are connected to the defect analysis place specifying device 20 and the inspection information accumulating device 30 through LAN 17.

An inspection result containing an inspection image in each step is transmitted from each of the post-print inspection machine 12, the post-mount inspection machine 14 and the post-reflow inspection machine 16 to the inspection information accumulating device 30 and stored therein, and read out from the defect analysis place specifying device 20 or the like as occasion demands.

Here, as post-reflow inspection results are generally considered "bridge" (solder is attached to electrodes of parts so that the electrodes are short-circuited to each other), "wet defect" (some defect occurs in the connection between the solder and the land or between the solder and the electrode of the part), "fillet abnormality" (the amount of solder is excessive or deficient and thus the profile line of the cross-section of solder does not have a well-proportioned shape like a mountain), and "omission" (no part exists).

Figure 2:
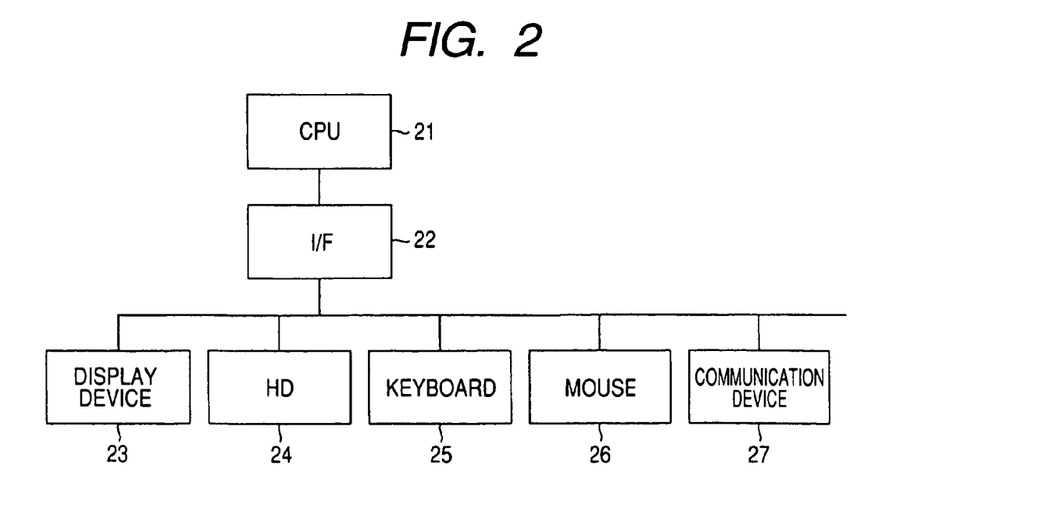
FIG. 2 is a block diagram showing the construction of the defect analysis place specifying device.

Next, the construction of the defect analysis place specifying device 20 will be described. FIG. 2 is a block diagram showing the construction of the defect analysis place specifying device 20. Referring to FIG. 2, the defect analysis place specifying device 20 is basically the same as a personal computer (hereinafter referred to as "PC"), and it contains CPU 21 for controlling the overall device, and ROM, RAM (not shown), a display device 23, a hard disk 24, a keyboard 25, a mouse 26, a LAN communication device 27, etc. which are connected to CPU 21 through an interface 22. The defect analysis place specifying device 20 is connected to the printing machine 11, the post-print inspection machine 12, the mounter 13, the post-mount inspection machine 14, the reflow furnace 15, the post-reflow inspection machine 16 and the inspection information accumulating device 30 by the LAN communication device 27.

The inspection information accumulating device 30 is a PC (personal computer) having basically the same construction as the defect analysis place specifying device 20. Inspection results of the respective steps are stored together with images in the hard disk. The inspection results and the inspection images may not be stored in the inspection information accumulating device 30, but may be stored in a storage unit such as a hard disk 24 of the defect analysis place specifying device 20 or the like. In this case, the inspection information accumulating device 30 is not required.

Figure 3:
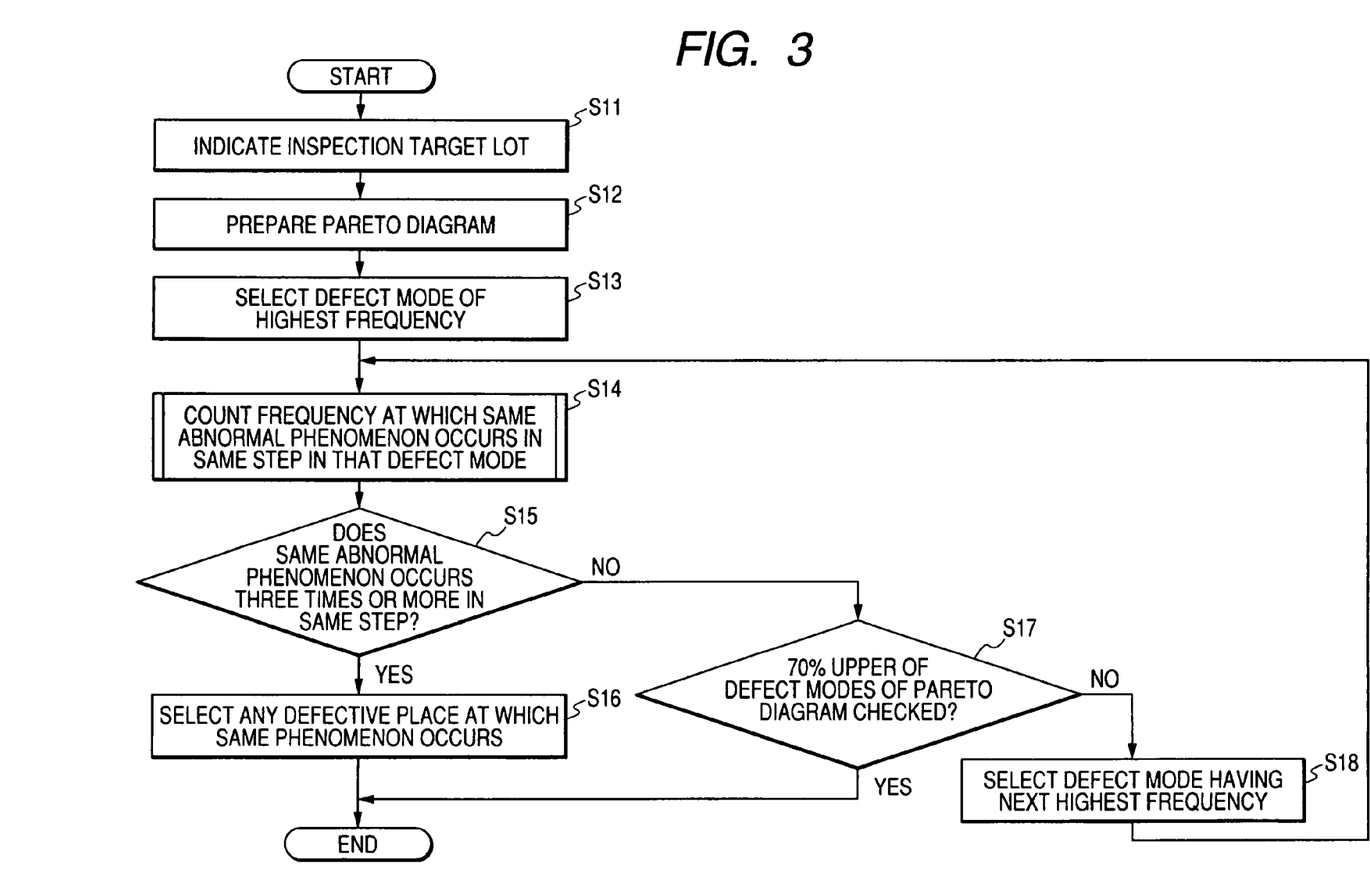
FIG. 3 is a flowchart showing the operation executed by CPU of the effect analysis place specifying device.

FIG. 3 is a flowchart showing the operation carried out by CPU 21 of the defect analysis place specifying device 20 shown in FIG. 2. Referring to FIG. 3, CPU 21 accepts plural printed wiring boards as inspection targets every predetermined unit from a user. With this acceptance, the keyboard 25 or the mouse 26 functions as an accepting unit. In this case, indication of a lot is accepted as a predetermined unit (step S11, hereinafter "step" is omitted). The predetermined unit is not limited to "lot", but any unit may be indicated as the predetermined unit. Here, the defect analysis means the analysis of defective contents occurring in the post-reflow inspection result detected in the last inspection after the reflow step. When an inspection target lot is indicated, the inspection result data of the inspection target lot are received from the inspection information accumulating device 30, a Pareto diagram of each defect mode specifying the content of a defect is created (S12), and then a defect mode having the highest frequency is selected (S13). Then, the frequency at which the same abnormal phenomenon occurs in the same defect mode is counted (S14). Accordingly, CPU 21 functions as a Pareto diagram creating unit and a defect mode specifying unit.

Here, the abnormal phenomenon is an event causing a defect mode. When defects can be specified on the basis of the inspection result data, the selection of the defect mode having the highest frequency and the count of the frequency at which the same abnormal phenomenon occurs in the same step in the same defect mode may be automatically executed by CPU 21 or counted by the user while referring to the inspection result images displayed on the display device 23. In this case, basically, CPU 21 makes a judgment on the basis of data and automatically executes the processing on the basis of the judgment based on data. With respect to data which require for the user to make a judgment while viewing images, this fact is displayed for the user for user's check.

Thereafter, it is judged whether the same abnormal phenomenon occurs three times or more in the same step (S15). If the same abnormal phenomenon occurs three times or more (YES in S15), any defective place is selected and extracted from the defective places where the same abnormal phenomenon occurs (S16). If the same phenomenon does not occur three times or more in the same step (NO in S15), this processing is executed until 70% upper defect modes of the Pareto diagram has been checked (i.e., upper defect modes that have high occurrence frequencies and occupy a predetermined rate or more in the Pareto diagram has been checked) (S17, S18). Accordingly, CPU 21 functions as an extracting unit.

In the above embodiment, the judgment as to whether the same abnormal phenomenon occurs three or more times in the same step is described. However, the present invention is not limited to this embodiment, and it may be judged whether the same abnormal phenomenon occurs any number of times or more. Furthermore, upper defect modes till 70% of the Pareto diagram are checked. However, the defect modes of any rate of the Pareto diagram may be checked. Furthermore, in the above embodiment, the Pareto diagram is created and defect modes having high frequencies are specified. However, defect modes having high frequencies may be specified by other methods.

The specific processing content will be described hereunder. FIGS. 4A to 4D.

Figure 4:
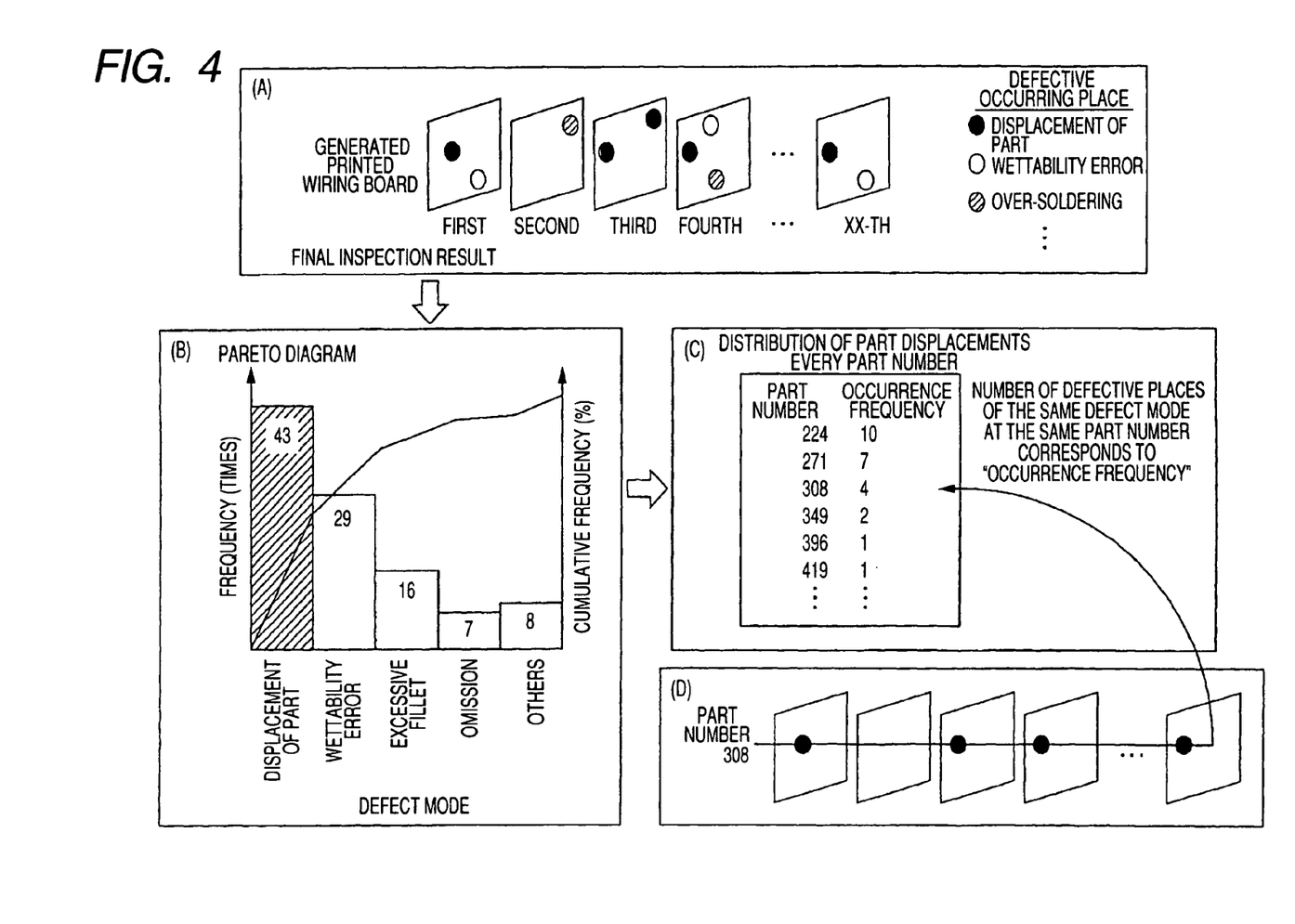
FIGS. 4A to 4D are diagrams showing a Pareto diagram representing defect modes of printed wiring boards and the occurrence frequencies of the respective defect modes, etc. in an indicated inspection target lot.

FIG. 4A shows defect modes of produced printed wiring boards in an indicated inspection target lot, FIG. 4B is a Pareto diagram representing the frequencies of respective defect modes, FIG. 4C shows a list of the occurrence frequency of the defect mode having the highest frequency in the Pareto diagram every part number, and FIG. 4D shows an image diagram of occurrence of defects for some specific part number (the part position on the printed wiring boards).

As a defect inspection result of printed wiring boards in the inspection target lot, a different defect (abnormal phenomenon) occurs every printed wiring board as shown in FIG. 4A. A Pareto diagram shown in FIG. 4B is created from this inspection result data. In this case, a defect mode "part displacement" occurs most frequently among defect modes such as "part displacement", "wettability error", "excessive fillet", "omission", etc. On the basis of this Pareto diagram, occurrence frequencies of defects are listed with respect to part numbers in the "part displacement" which is the defect mode having the highest frequency. The Pareto diagram is displayed on the display device 23.

Next, a method of counting the frequency at which the same abnormal phenomenon occurs in the same step in the defect mode described in S14 will be described.

Figure 5:
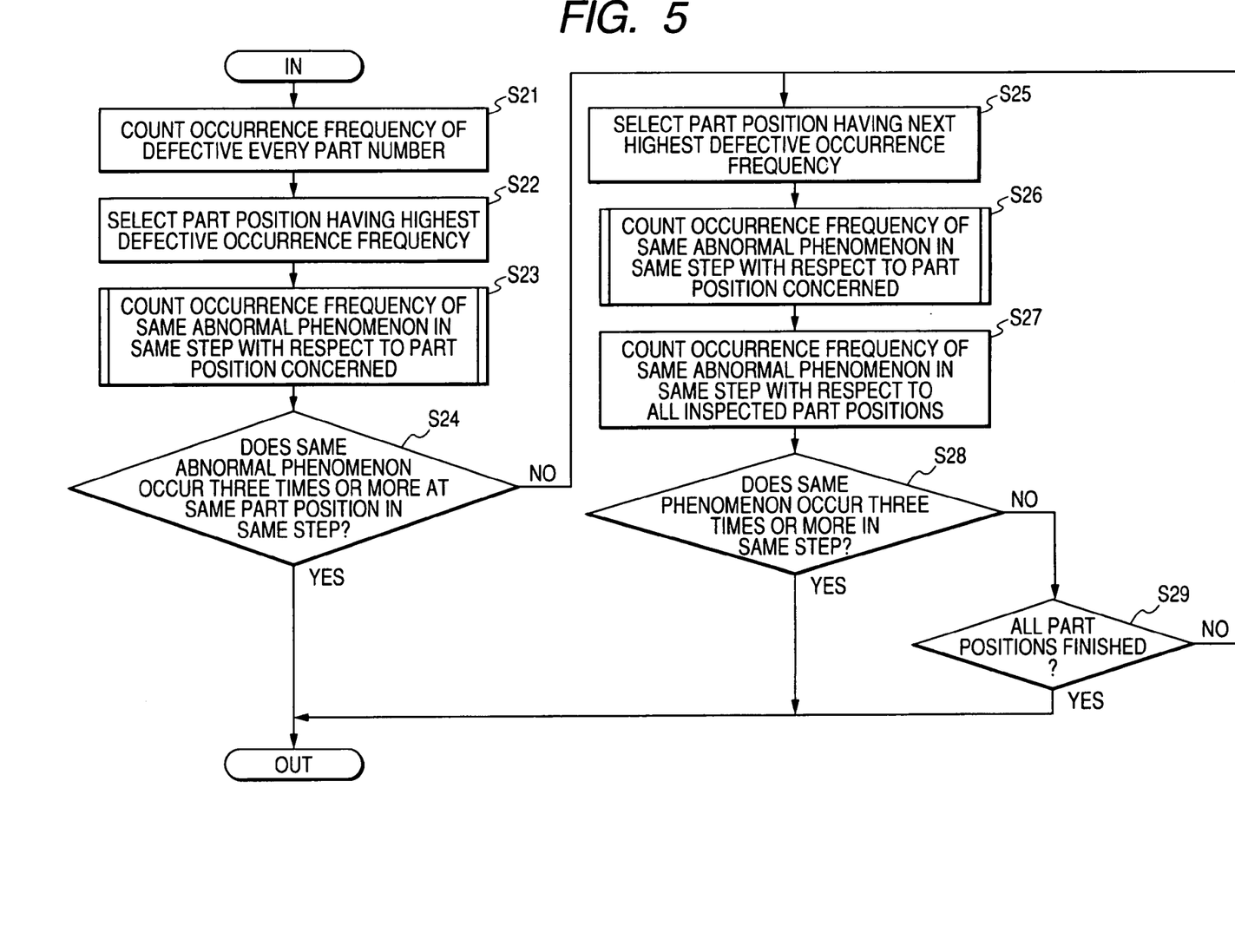
FIG. 5 is a flowchart showing a sub routine representing the processing content shown in S14.

FIG. 5 is a flowchart showing a sub routine representing the processing content shown in S14. Referring to FIG. 5, a defect occurring frequency is counted every part position (S21), and the part position having the highest defect occurrence frequency is selected (S22). Subsequently, with respect to the selected part position, the frequency at which the same abnormal phenomenon occurs in the same step is counted (S23). Furthermore, it is judged whether the same abnormal phenomenon occurs three times or more at the same part position in the same step (S24). Here, the count of the frequency at which the same abnormal phenomenon occurs in the same step may be carried out by CPU 21 or the user as described above.

If the abnormal phenomenon occurs three times or more at the same part position in the same step, the processing directly returns (YES in S24). If the same abnormal phenomenon does not occur three times or more at the same position in the same step (NO in S24), a part position having the second highest defect occurrence frequency is selected (S25), and the frequency at which the same abnormal phenomenon occurs in the same step is counted with respect to the part position concerned (S26). Furthermore, with respect to all the part positions which have been inspected, the frequency at which the same abnormal phenomenon occurs in the same step is counted (S27). Then, it is judged whether the same abnormal phenomenon occurs three times or more in the same step (S28). If the same abnormal phenomenon occurs three times or more in the same step (YES in S28), the processing directly returns. If the same abnormal phenomenon does not occur three times or more in the same step (NO in S28), the processing of S25 to S28 is executed on a part position having the next highest defect occurrence frequency until the check for all the part positions has been completed (S29).

Next, the processing when the count of the frequency at which the same abnormal phenomenon occurs in the same step as shown in S23 is carried out by the user.

Figure 6:
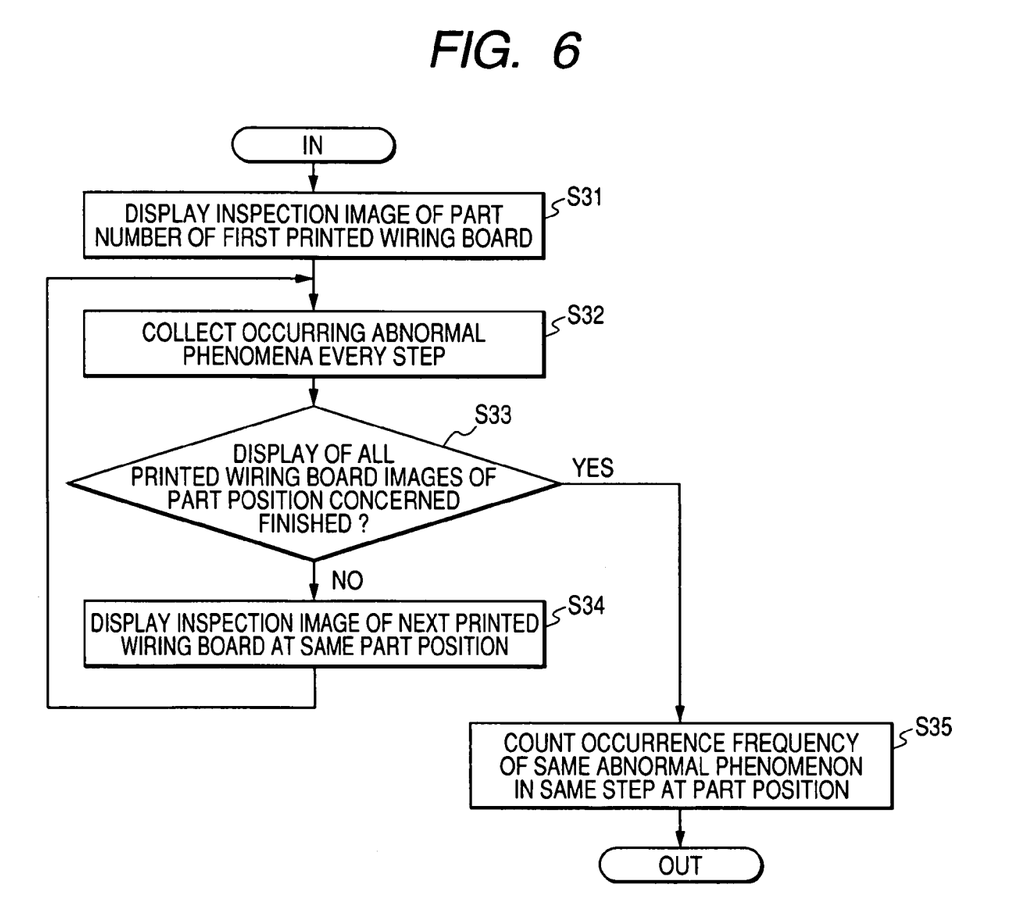
FIG. 6 is a flowchart showing a sub routine representing the processing content shown in S23.
Figure 7:
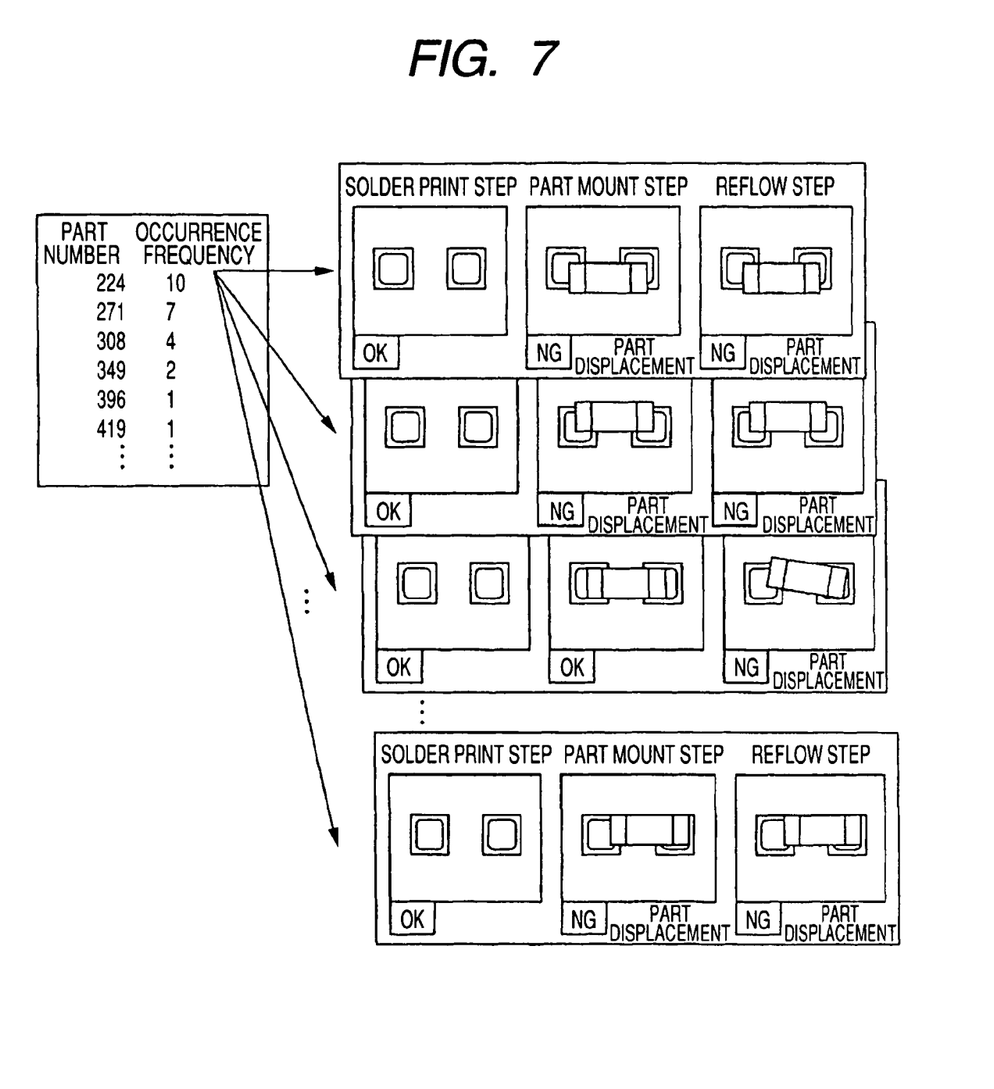
FIG. 7 is a diagram showing an example of the processing in FIG. 6.

FIG. 6 is a flowchart showing a sub routine representing the processing content shown in S23, and FIG. 7 is a diagram showing an example of the processing of FIG. 6 and shows inspection result images of printed wiring boards on which abnormal phenomena occur at the part number 224. These images are displayed on the display device 23.

Referring to FIG. 7, the inspection images at the same part position of the same printed wiring board in the respective steps such as the print step, the mount step (part mounting step) and the reflow step are displayed in parallel. It is assumed that a printed wiring board judged as a defect (for example, "part displacement") is displayed as "NG part displacement" in advance in the inspection machine of each step. As described above, the part number represents the part position on the printed wiring board, and thus the same part number means the same part position.

Referring to FIGS. 6 and 7, an inspection image of a part position of a first printed wiring board is displayed on the display (S31), and abnormal phenomena (defects) occurring every step are collected (S32). The above processing is repeated until the images of the part position concerned of all the printed wiring boards are displayed (S33 to S34), and the frequency at which the same abnormal phenomenon occurs at the part position concerned is counted (S35).

Specifically, the user refers to the inspection images shown in FIG. 7 to check defects every part number, counts the occurrence frequency of the defects every step and inputs the count result from the keyboard 25, the mouse 26 or the like. An example of the count is shown at the left side of FIG. 7.

At this time, with respect to the part number having the highest occurrence frequency of a defect under analysis, the inspection images of the respective steps are successively displayed from the first produced printed wiring board among the printed wiring boards on which the defect concerned occurs. The inspection result of each step or the measurement value may be simultaneously displayed.

Furthermore, if there are identified three or more printed wiring boards on which the same defects having the same defect mode occur at the same part position, the processing may be finished at that time point.

Figure 8:
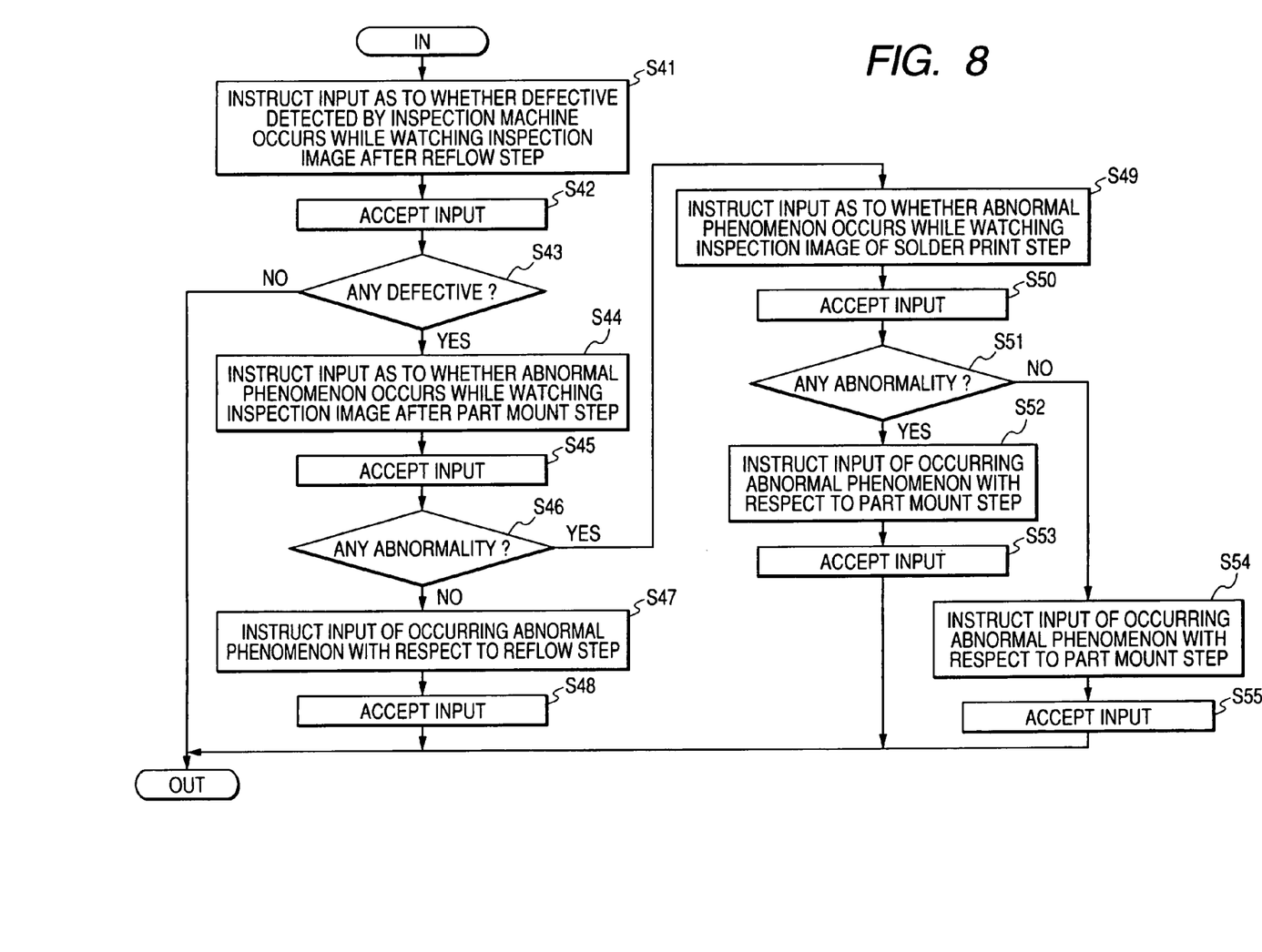
FIG. 8 is a flowchart showing the processing content of a method for collecting abnormal phenomena occurring every step.

Next, a method of collecting abnormal phenomena occurring every step shown in S32 will be described. FIG. 8 is a flowchart showing the processing content of this method. In this case, the processing of successively inputting the defects in each of the reflow step, the mount step (part mounting step) and the print step from the downstream side is executed.

Referring to FIG. 8, first, CPU 21 instructs the defect analysis place specifying device 20 to make the user input whether a defect occurs or not while the user watches the inspection image after the reflow step (S41). The input from the user is accepted (S42). If there is any defect in this step (S43), then it is instructed to make the user input whether any abnormal phenomenon occurs while the user watches the inspection image after the part mounting step (S44), and then the input from the user is accepted (S45). If there is no abnormality in this step, it is instructed to make the user input whether any abnormality occurring in the reflow step, and the input from the user is accepted (S48).

If the user judges in S46 that some abnormal phenomenon occurs in the part mount step (YES in S46), it is instructed to make the user input whether any abnormal phenomenon occurs while the user watches the inspection image in the solder print step (S49), and then the input from the user is accepted (S50). If there is some abnormality in this step (YES in S51), the input of an abnormal phenomenon occurring in the part mount step is instructed (S52), and then the input from the user is accepted (S53).

If the user judges in S51 that no abnormal phenomenon occurs in the part mount step (NO in S51), the input of an abnormal phenomenon occurring in the part mount step is instructed (S54), and then the input from the user is accepted (S55).

Figure 9:
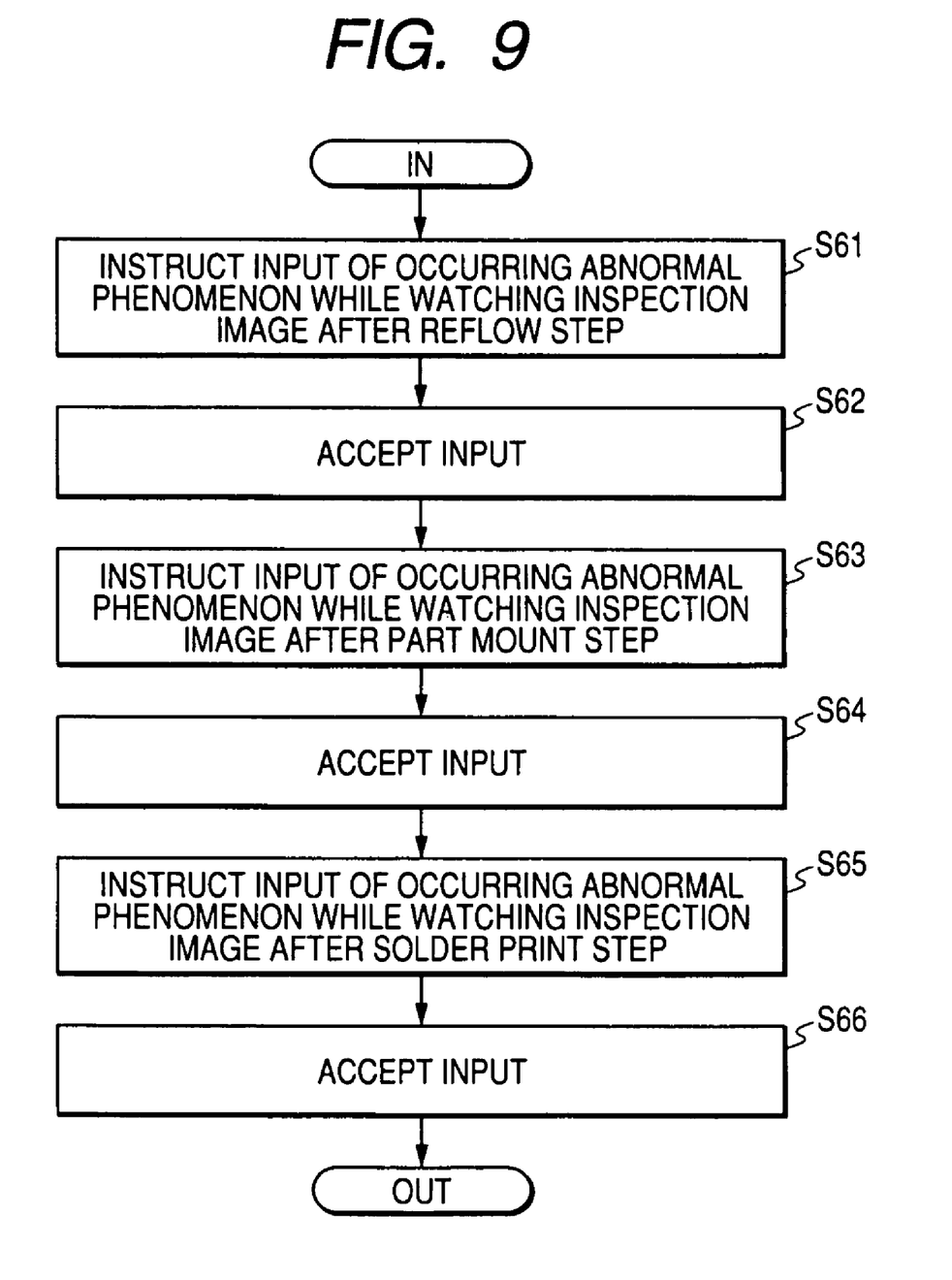
FIG. 9 is a flowchart showing the processing content of another method for collecting abnormal phenomena occurring every step.

Next, another method of collecting abnormal phenomena occurring every step shown in S32 will be described. FIG. 9 is a flowchart showing the processing content of this method. In this case, the respective inputs for the reflow step, the part mount step and the print step are sequentially accepted unlike the foregoing example.

Referring to FIG. 9, first, CPU 21 instructs the user to input an occurring abnormal phenomenon while the user watches the inspection image after the reflow step (S61), and then accepts the input from the user (S62). Subsequently, CPU 21 instructs the user to input an occurring abnormal phenomenon while the user watches the inspection image of the part mount step (S63), and then accepts the input from the user (S64). Subsequently, CPU 21 instructs the user to input an occurring abnormal phenomenon while the user watches the inspection image of the solder print step (S65), and then accepts the input from the user (S66).

Next, a specific method of making the user input an abnormal phenomenon will be described.

Figure 10:
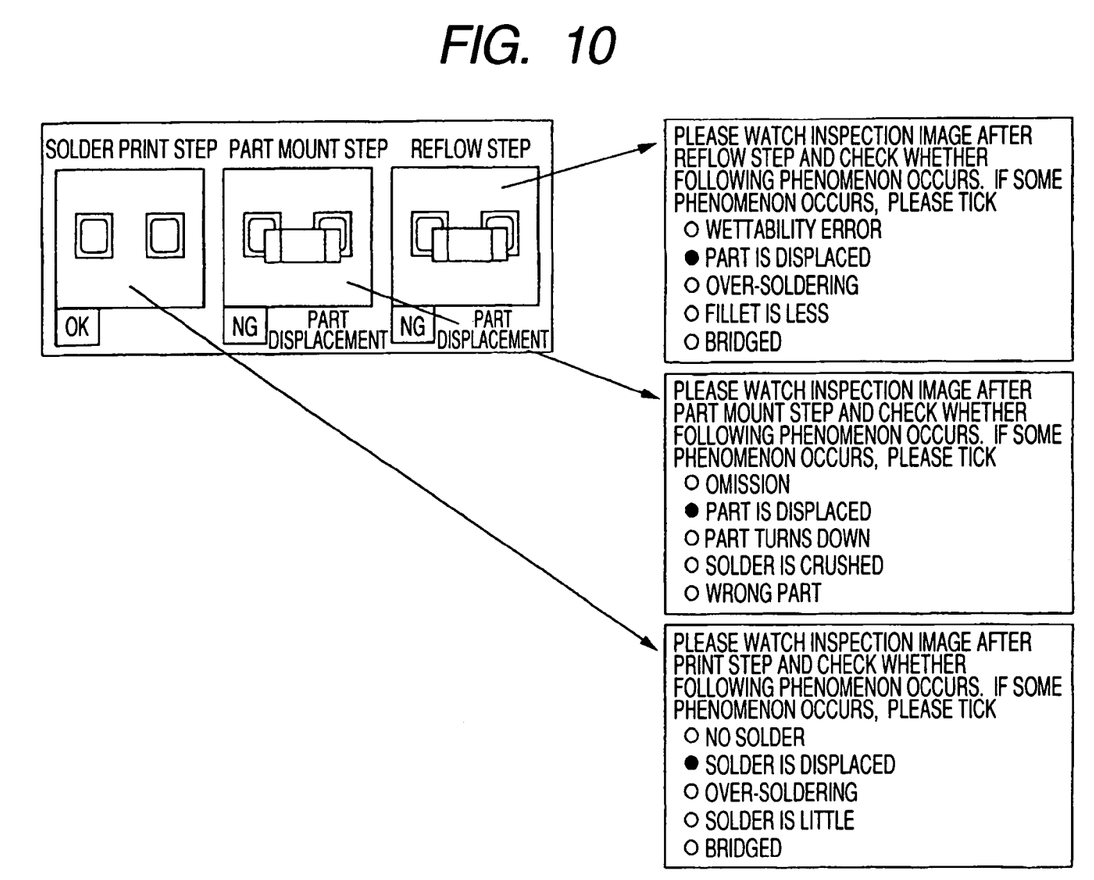
FIG. 10 is a diagram showing an example of a method of making a user input an abnormal phenomenon.

FIG. 10 is a diagram showing an example which is displayed on the display device 23 and makes the user input an abnormal phenomenon. The left side of FIG. 10 shows inspection images of the respective steps, and the right side of FIG. 10 is a diagram showing a display example for making the user input an abnormal phenomenon in each step. Referring to FIG. 10, the inspection images are presented to the user through the display device 23, and the user watches these inspection images to select the content of abnormal phenomena by using the keyboard 25 or the mouse 26 (detect information accepting unit).

That is, with respect to the inspection image after the reflow step, contents which are judged as abnormal phenomena such as "wettability error", "part displacement", "over-soldering", "deficient fillet", "bridged", etc. by each inspection machine are displayed for the user, and the user selects from these abnormal phenomena a content identified by himself/herself. The same operation is carried out on the part mount step and the solder print step.

It is preferable that the abnormal phenomena to be identified by the user contain not only the contents judged as abnormal phenomena by the inspection machines such as the post-print inspection machine 12, the post-mount inspection machine 14 and the post-reflow inspection machine 16, but also abnormal phenomena which cannot be judged by the inspection machines. The judgment can be performed by the inspection machines. In this case, however, it takes much time to carry out tuning and the precision is low. Therefore, there are phenomena which are not contained in the inspection items shown in FIG. 10. These items are preferably checked by the user. For example, there are phenomena such as "blur of solder" and "sags of solder" in the print step and "solder is crushed by parts".

Next, a method of counting abnormal phenomena will be described.

Figure 11:
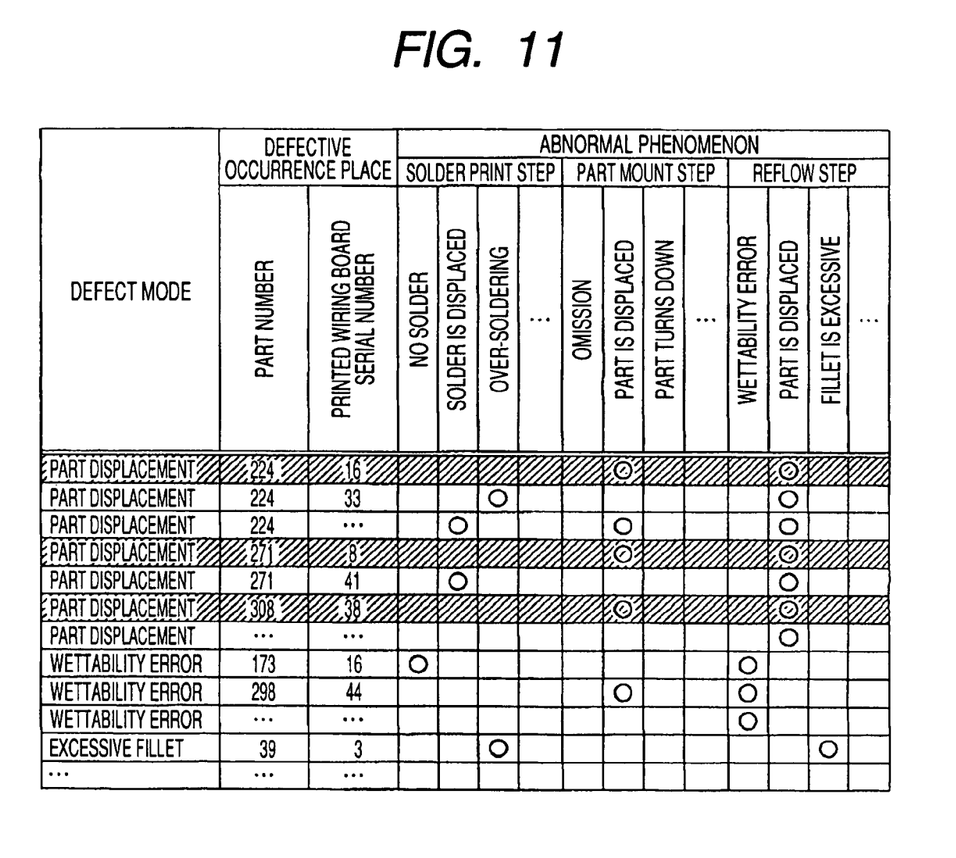
FIG. 11 is a diagram showing a data list as a method of counting every abnormal phenomenon.

FIG. 11 is a diagram showing a method of counting on an abnormal phenomenon basis. CPU 21 creates a data list containing part numbers as defect occurring places, printed wiring board serial numbers and input abnormal phenomena every defect mode as shown in FIG. 11 on the basis of the contents input as shown in FIG. 10. Here, the printed wiring board serial numbers are numbers representing the order of producing printed wiring boards. The abnormal phenomena contain inherent defective contents in the print step, the part mount step and the reflow step. A set containing three or more defective places having the same defect mode, the same part number and the same abnormal phenomenon is extracted from this data list. The data list is displayed on the display device 23. Accordingly, CPU 21 functions as a data list creating unit.

If there is no set containing three or more defective places having the same defect mode, the same part number and the same abnormal phenomenon, a set in which the respective items of the defect mode, the part number and the abnormal phenomenon are coincident is extracted.

If there is no set in which the respective items of the defect mode, the part number and the abnormal phenomenon are coincident, a set containing three or more defective places having the same defect mode and the same abnormal phenomenon is extracted.

If there is no set containing three or more defective places having the same defect mode and the same abnormal phenomenon is extracted, a set in which the respective items of the defect mode and the abnormal phenomenon are coincident is extracted.

In the example shown in FIG. 11, there is no set containing three or more defective places having the same defect mode, the same part number and the same abnormal phenomenon, however, there exists a set containing three defective places having the same defect mode and the same abnormal phenomenon, the printed wiring board serial number 8 and the part number 271, the printed wiring board serial number 16 and the part number 224 and the printed wiring board serial number 38 and the part number 308. Therefore, this set is extracted as analysis places.

The extraction of the corresponding set from the data list shown in FIG. 11 may be carried out by the user. The combination of the defect mode thus extracted is displayed on the display device 23, and also output to any output device. Accordingly, the display device and any other device function as an output unit.

The defect mode corresponds to the consolidated one of abnormal phenomenon in the reflow step which is the last step of the part mounting device. Therefore, the defect mode is different from the abnormal phenomenon of the reflow step. However, in the case of the same inspection item, any one of them may be omitted.

As described above, according to the present invention, a set of defective places which are estimated as occurring due to a common defect factor can be automatically extracted and specified. Therefore, even a user who is not skilled in improvement can efficiently improve the defect. Furthermore, the defective fraction can be reduced at an early stage, and thus the defect occurrence frequency can be reduced.

In the above embodiment, the operation when the defect analysis place specifying device is a dedicated device has been described. However, the present invention is not limited to this embodiment, and the present invention may be applied to a case where the defect analysis place specifying device is constructed by a general-purpose personal computer, all the above operations are programmed, and the personal computer is used as the defective analysis place specifying device by operating the personal computer with the program. In this case, the program may be supplied as a recording medium such as an optical disk, a hard disk or the like, or may be downloaded through a network from a server on the network.

The present invention is not limited to the above embodiment, and various alterations and modifications may be added within the same scope as the present invention or within an equivalent scope to the present invention.

What is claimed is:

1. A defect analysis place specifying device for specifying defect analysis places from an inspection result of produced printed wiring boards in an electronic part mounting device for mounting parts on the printed wiring boards through plural steps including a last step and other steps other than the last step, comprising:
   an accepting unit for accepting plural printed wiring boards as inspection targets every predetermined unit;
   a defect mode specifying unit for specifying a defect mode having a predetermined frequency or more on the basis of the defect modes of the printed wiring boards and the occurrence frequencies thereof in the last step of the plural steps for every unit accepted by the accepting unit;
   an extracting unit for extracting from a data list of entries containing abnormal phenomena in the other steps and the occurrence positions thereof, a combination of the entries having the same abnormal phenomenon causing the defect mode specified by the defect mode specifying unit; and
   an output unit for outputting the combination extracted by the extracting unit.

2. The defect analysis place specifying device according to claim 1, wherein the defect mode specifying unit comprises a Pareto diagram creating unit for creating a Pareto diagram representing the defect modes of the printed wiring boards in the last step of the plural steps and the occurrence frequencies of the defect modes concerned, a defect mode having a predetermined frequency or more being specified from the Pareto diagram created by the Pareto diagram creating unit.

3. The defect analysis place specifying device according to claim 1, wherein the defect mode having the predetermined frequency or more that is specified by the defect mode specifying unit is a defect mode having the highest frequency.

4. The defect analysis place specifying device according to claim 1, wherein the defect mode having the predetermined frequency or more that is specified by the defect mode specifying unit is a defect mode contained in upper defect modes that have high occurrence frequencies and occupy a predetermined rate or more in the Pareto diagram.

5. The defect analysis place specifying device according to claim 1, wherein the extracting unit extracts the combination having the same abnormal phenomenon in consideration of the position on the printed wiring board.

6. The defect analysis place specifying device according to claim 1, wherein the extracting unit contains a data list creating unit for creating the data list.

7. The defect analysis place specifying device according to claim 6, wherein the extracting unit automatically creates the data list.

8. The defect analysis place specifying device according to claim 6, further comprising a storage unit for storing images of each of the printed wiring boards in the plural steps, wherein the extracting unit comprises a display unit for displaying the images stored in the storage unit, and a defect information accepting unit for accepting an input of defect information associated with the images displayed on the display unit, and the data list creating unit creates a data list on the basis of the defect information accepted by the defect information accepting unit.

9. A defect analysis place specifying method for specifying defect analysis places from an inspection result of produced printed wiring boards in an electronic part mounting device for mounting parts on the printed wiring boards through plural steps including a last step and other steps other than the last step, comprising:

an accepting step, performed using a computer, for accepting plural printed wiring boards as inspection targets every predetermined unit;

a defect mode specifying step, performed using the computer, for specifying a defect mode having a predetermined frequency or more on the basis of the defect modes of the printed wiring boards and the occurrence frequencies thereof in the last step of the plural steps every accepted unit;

an extracting step, performed using the computer, for extracting from a list of entries containing abnormal phenomena in the other steps and the occurrence positions thereof, a combination having the same abnormal phenomenon causing the defect mode specified in the defect mode specifying step; and an output step, performed using the computer, for outputting the extracted combination.

10. The defect analysis place specifying method according to claim 9, wherein the step for specifying the defect mode having the predetermined frequency or more comprises a step of creating a Pareto diagram representing the defect modes of the printed wiring boards in the last step of the plural steps and the occurrence frequencies of the defect modes concerned every accepted unit, and a step for specifying a defect mode having a predetermined frequency or more from the created Pareto diagram.

* * * * *